United States Patent [19]
Carichner

[11] Patent Number: 6,008,532
[45] Date of Patent: Dec. 28, 1999

[54] INTEGRATED CIRCUIT PACKAGE HAVING BOND FINGERS WITH ALTERNATE BONDING AREAS

[75] Inventor: Karla Y. Carichner, Pleasanton, Calif.

[73] Assignee: LSI Logic Corporation, Milpitas, Calif.

[21] Appl. No.: 08/956,682

[22] Filed: Oct. 23, 1997

[51] Int. Cl.$^6$ ............ H01L 23/52; H01L 23/28; H01L 29/44; H05K 1/11
[52] U.S. Cl. ............ 257/691; 257/784; 257/786; 257/698; 257/696; 257/782; 257/692; 361/712; 361/820; 361/777; 174/52.4; 174/261
[58] Field of Search ............ 757/678, 784, 757/786, 691, 666, 780, 676, 690, 782, 775, 783, 673, 693, 398, 696, 692; 361/761, 772, 777, 820, 760, 764; 174/52.4, 261

[56] References Cited

U.S. PATENT DOCUMENTS

| | | | |
|---|---|---|---|
| 4,195,195 | 3/1980 | de Misanda et al. ............ 361/408 |
| 4,951,098 | 8/1990 | Albergo et al. . | |
| 4,980,802 | 12/1990 | Champagne et al. ............ 361/401 |
| 5,018,005 | 5/1991 | Lin et al. ............ 361/408 |
| 5,168,368 | 12/1992 | Gow, III et al. ............ 257/666 |
| 5,208,658 | 5/1993 | Murata ............ 257/775 |
| 5,309,316 | 5/1994 | Yagi et al. ............ 257/692 |
| 5,373,187 | 12/1994 | Sugino et al. ............ 257/691 |
| 5,441,917 | 8/1995 | Rostoker et al. ............ 437/195 |
| 5,444,303 | 8/1995 | Greenwood et al. ............ 257/666 |
| 5,465,406 | 11/1994 | Kurashima ............ 257/678 |
| 5,483,100 | 1/1996 | Marrs et al. ............ 257/700 |
| 5,489,059 | 2/1996 | Rostoker et al. ............ 228/175 |
| 5,565,385 | 10/1996 | Rostocker et al. ............ 437/209 |
| 5,567,655 | 10/1996 | Rostoker et al. ............ 437/209 |
| 5,587,607 | 12/1996 | Yasuda et al. ............ 257/784 |
| 5,635,424 | 6/1997 | Rostoker et al. ............ 438/612 |
| 5,650,651 | 7/1997 | Bui ............ 257/786 |
| 5,650,660 | 7/1997 | Barrow ............ 257/786 |
| 5,656,854 | 8/1997 | Westerkamp ............ 257/666 |
| 5,686,764 | 11/1997 | Fulcher ............ 257/691 |
| 5,719,449 | 2/1998 | Strauss ............ 257/786 |
| 5,726,680 | 3/1998 | Mozdzen ............ 257/786 |
| 5,734,559 | 3/1998 | Banerjee et al. ............ 361/761 |
| 5,742,079 | 4/1998 | Poi ............ 257/786 |
| 5,744,859 | 4/1998 | Ouchida ............ 257/786 |
| 5,764,497 | 6/1998 | Mizumo ............ 257/786 |
| 5,767,566 | 6/1998 | Suda ............ 257/666 |
| 5,773,855 | 6/1998 | Colwell et al. ............ 257/786 |
| 5,773,856 | 6/1998 | Beardens et al. ............ 257/786 |
| 5,783,868 | 7/1998 | Gallaway ............ 257/784 |
| 5,796,171 | 8/1998 | Koe et al. ............ 257/786 |
| 5,801,450 | 9/1998 | Barrow ............ 257/786 |
| 5,801,927 | 9/1998 | Watanabe ............ 257/692 |
| 5,814,893 | 9/1998 | Hsu et al. ............ 257/786 |
| 5,898,213 | 4/1999 | Torres et al. ............ 257/666 |

*Primary Examiner*—Alexander Oscar Williams

[57] ABSTRACT

A leadframe having individual bond fingers incorporating two or more alternate bonding areas. In one embodiment, conventional bond fingers having bonding areas in an outer row are augmented to include an additional conductive trace or intermediate portion terminating in a bonding area that is in general alignment with an inner row of bonding areas. Likewise, bond fingers having bonding areas in an inner row are enlarged to include an alternate bonding area that is in general alignment with the outer row of bonding areas. In another embodiment, bond fingers are arranged to provide multiple rows of closely-spaced staggered bonding areas to reduce bonding pitches. By providing alternate bonding areas in individual bond fingers, the manufacturing rules addressing staggered bond wire placement can be followed more readily, while simultaneously permitting the most convenient bond fingers to be utilized. The invention thereby adds significant flexibility to current staggered bonding techniques, and allows for a reduction in the size of many semiconductor dies.

8 Claims, 3 Drawing Sheets

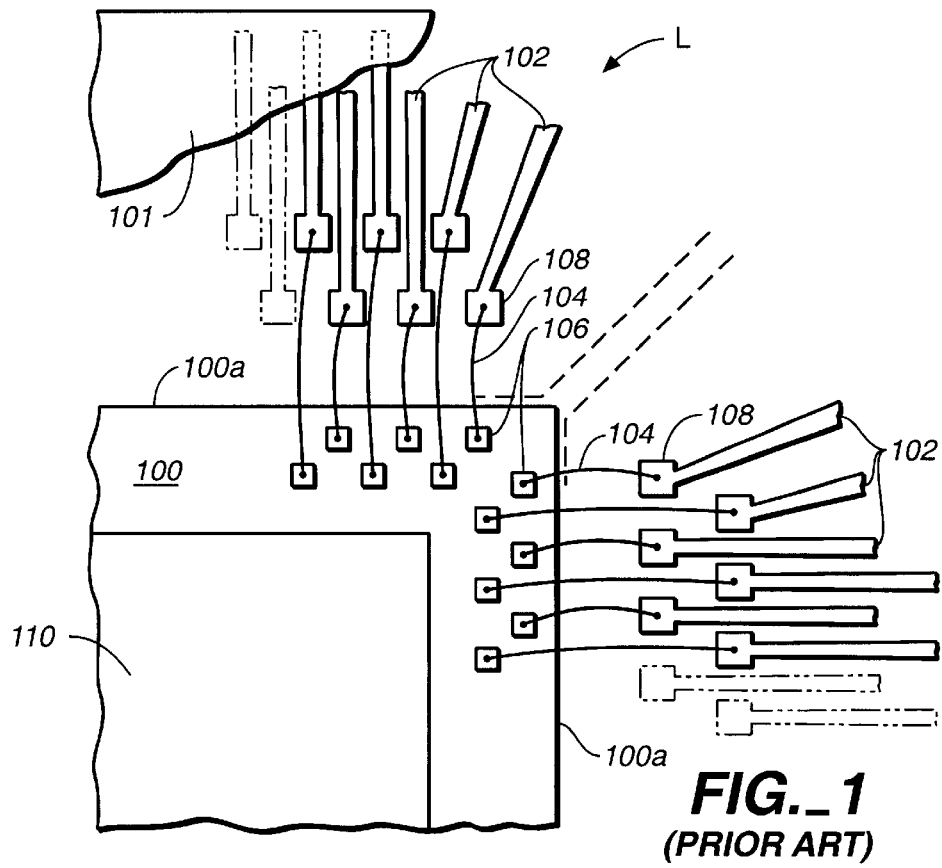
FIG._1
(PRIOR ART)
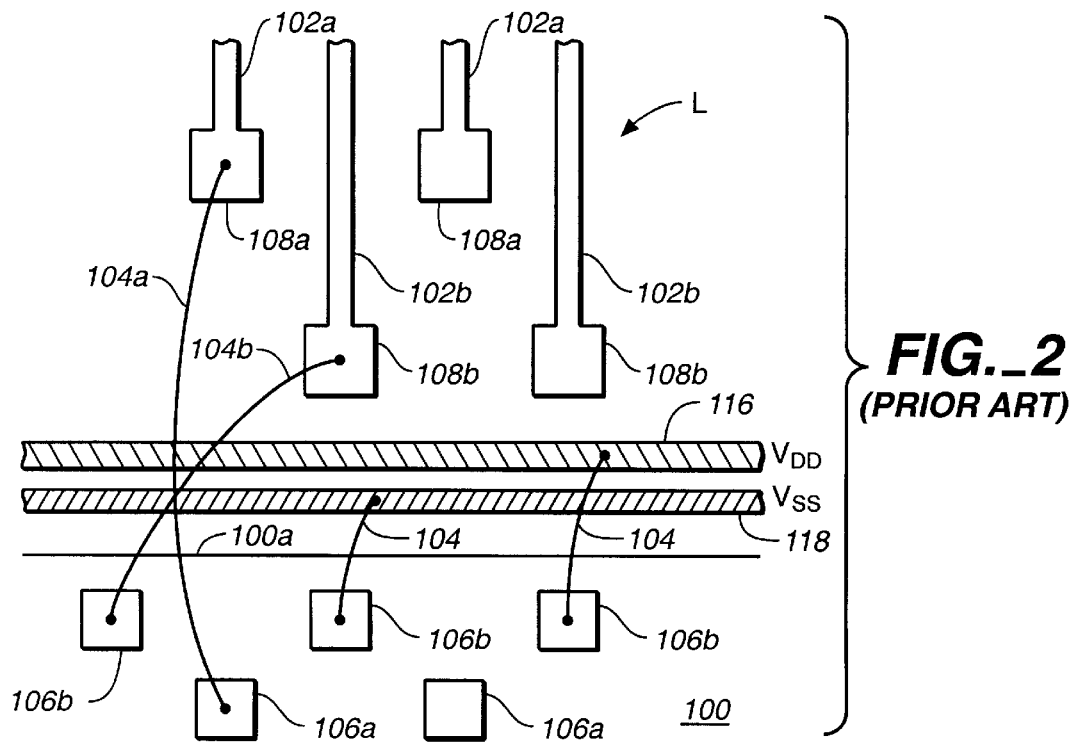
FIG._2
(PRIOR ART)

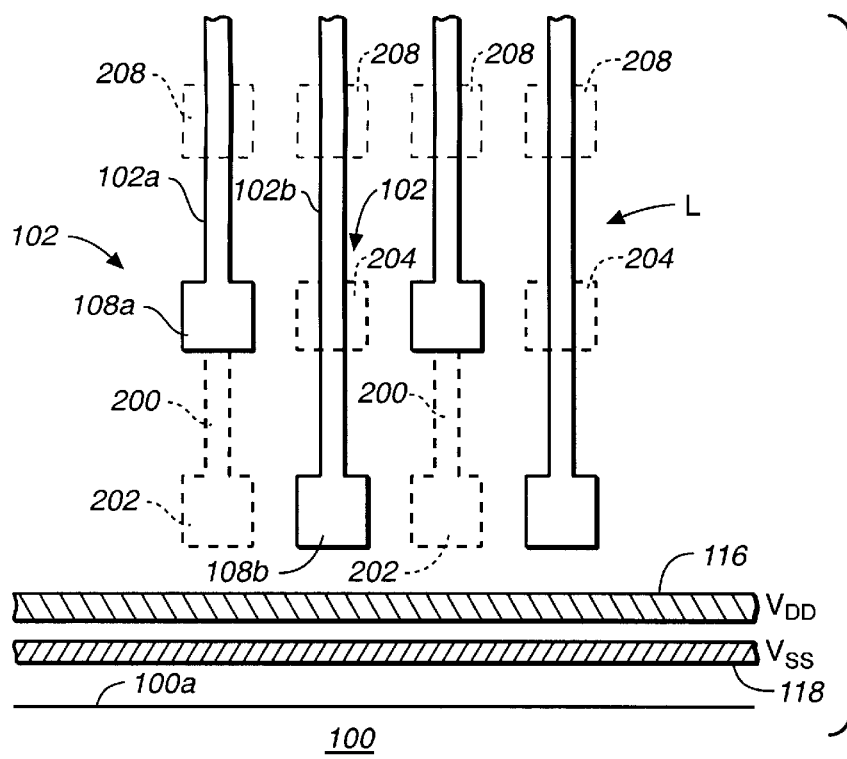
FIG._3
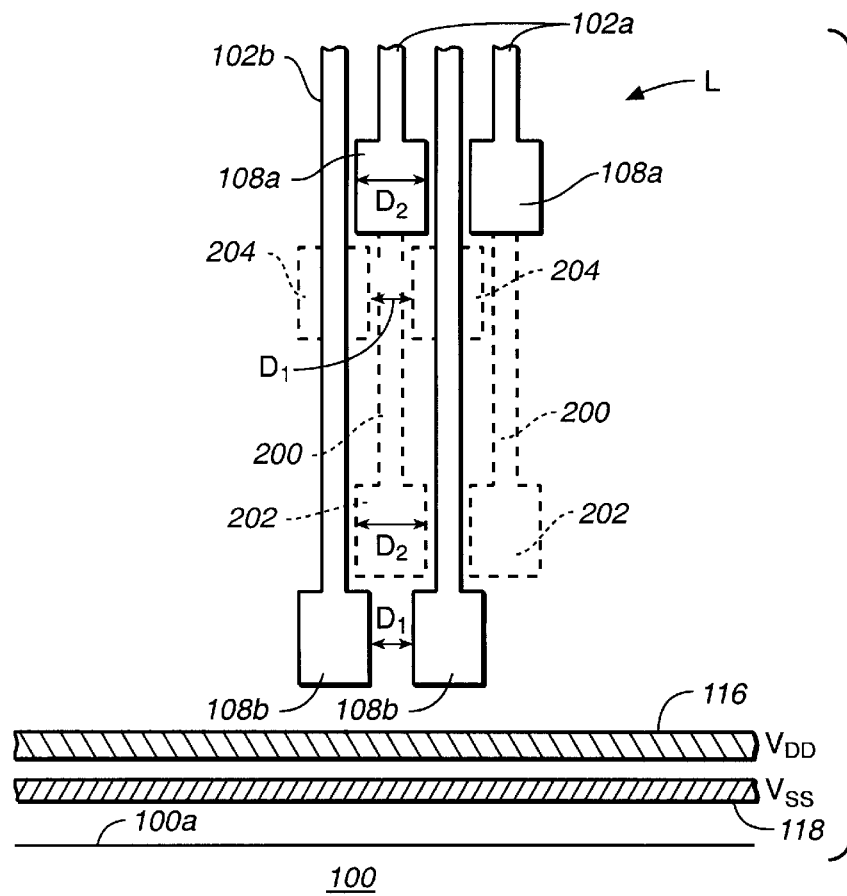
FIG._4

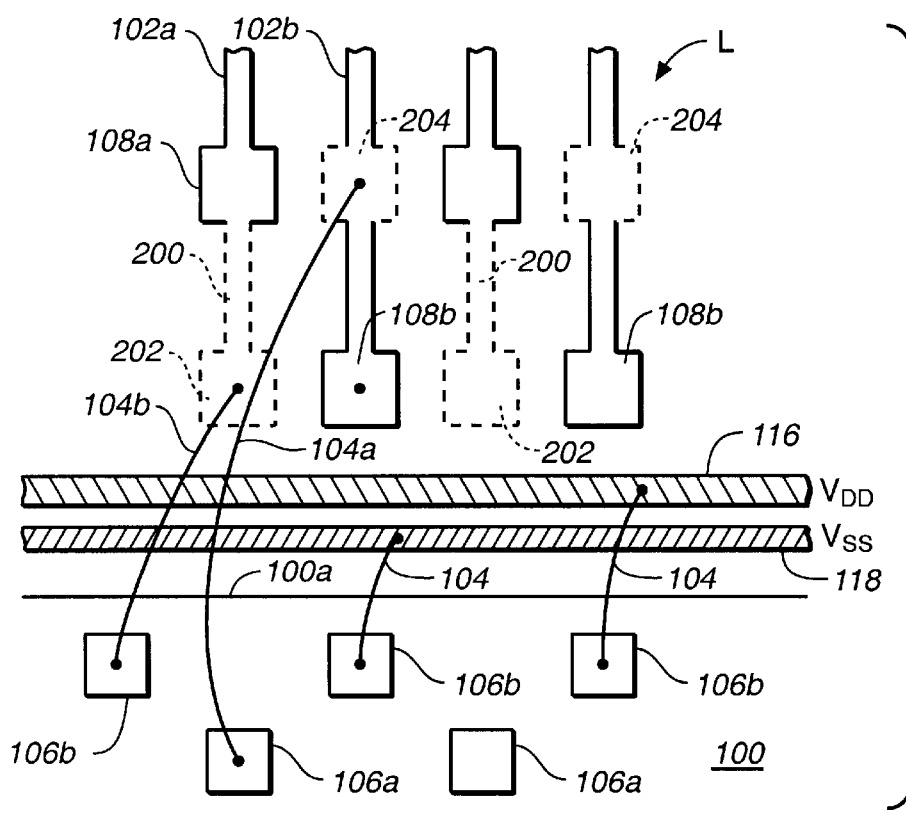
FIG._5

INTEGRATED CIRCUIT PACKAGE HAVING BOND FINGERS WITH ALTERNATE BONDING AREAS

BACKGROUND OF THE INVENTION

1. Field of the Invention

The invention relates to packages for integrated circuits, and more particularly to a leadframe or packaging substrate having individual bond fingers with alternate bonding areas.

2. Description of the Related Art

Integrated circuits (ICs) have become essential components of many consumer and commercial electronic products produced today, often replacing large numbers of discrete components and providing enhanced functionality. The semiconductor processing technologies that produce these integrated circuits have advanced to the point where complete systems can often be reduced to a single integrated circuit. Continually shrinking device geometries and corresponding advances in circuit density have resulted in reduced core sizes for such integrated circuits. However, various packaging limitations have prevented a corresponding reduction in the size of I/O pad circuitry.

FIG. 1 shows various components of a semiconductor device package according to the prior art. A typical packaged integrated circuit contains many components. Individual, unpackaged integrated circuits are often referred to as a semiconductor "die" 100. A "leadframe" L is a sheet metal or similar framework upon which the semiconductor die 100 is attached, wire-bonded, and transfer molded with resin 101 or similar material to form the packaged semiconductor device. The leads of the leadframe L include sections referred to as "external leads" (not shown) that connect the finished device package to external circuitry such as a printed circuit board.

"Internal leads" or bond fingers 102 are sections of the leads in a leadframe that are inside the package body outline. More precisely, the term "bond finger" relates to an end portion of an internal lead that includes a "bonding area" 108. Very small diameter bonding wires 104 (usually formed of aluminum or gold) are attached between "bond pads" 106 on a semiconductor die 100 and the leadframe L. In a typical leadframe L, the external leads are individually electrically coupled with the bond fingers 102 and are formed from an unbroken section of conductive material to remove the need for lead clamping and to provide structural support during the packaging process.

The bonding area (also referred to as a "lead flat surface") 108 is generally wider than the nominal width of the elongated bond finger 102 and delineates the desired area of the bond finger 102 for wire bonding. The bonding area 108 may be specified as a percentage of the nominal bond finger 102 width for a specified length for both stamped and etched leadframes L. To provide a flat surface for bonding, the bonding area 108 of the bond finger 102 is often coined or flattened with a punch if the leadframe L is stamped, and may be plated with nickel or gold. As shown in FIG. 1, the bond fingers 102 approach the semiconductor die 100 within the semiconductor device package in a generally radial ("fan-in") pattern, or in parallel ranks approaching one or more edges 100a of the semiconductor die 100.

The term bond pad (or "bonding pad") 106 refers herein to a relatively large metallic area positioned on a planar surface of the semiconductor die 100. Bond pads 106 function to provide electrical contact between the semiconductor die 100 and the leadframe L via the bond wires 104 or "solder bump" (micro-bump) connections. Bond pads 106 are commonly incorporated in layout structures known as "pad cells" (not separately illustrated). The pad cells are typically disposed in rows about the periphery of the semiconductor die 100 in a ring-shaped area on the surface of the die between the edges 100a of the semiconductor die 100 and a core logic region 110. In addition to the bond pad 106, pad cells customarily include electrostatic discharge (ESD) protection circuitry and I/O circuitry such as pad drivers, slew rate control circuitry, and current spike suppression logic.

Often, the leadframe L is held together by sacrificial "bridges" between the external leads, which are removed after the leadframe L is bonded to the semiconductor die 100 and a package body is formed. The external leads then effectively provide separate electrical signal lines to the bond pads 106 of the semiconductor die 100. Following packaging of the assembly of FIG. 1 via a plastic molding process or other means, the external leads are singulated and individual pins are formed to provide electrical coupling to external circuitry.

Packaging substrates other than the traditional leadframe have also been developed, such as those used in ball-grid arrays (BGAs). Essentially, a BGA is an integrated circuit surface mount package with an array of solder balls that are attached to the bottom side of a thin, patterned substrate with conductive routing layers that include areas similar to the disclosed bond fingers 102. The solder balls are typically formed via a reflow process, while the semiconductor die 100 may be attached to the substrate using wire bonding or "flip-chip" interconnection.

Bond pads 106 and the associated pad cell circuitry are often variable in terms of pitch and size. The pitch is typically defined as a repeated distance between adjacent bond pads 106. Minimum bond pad pitch is limited by a number of factors, including minimum bond wire 104 width and the space temporarily occupied by the tool used to deposit the bond wires 104.

One reason for placing bond pads 106 around the periphery of the semiconductor die 100 is that such placement permits a large number of I/O connections to the semiconductor die 100 without unnecessarily long or crossing bond wires 104. However, bond pad pitch is often a limiting factor in the reduction of semiconductor die 100 size, particularly in integrated circuit designs that are I/O intensive. Such designs are often "pad-limited" (i.e., the size of the semiconductor die 100 is significantly greater than the size of the core logic region 110 due to the periphery space required to accommodate the rows of bond pads 106). Thus, appreciable gains in the utilization of the expensive silicon area in such designs can often be realized by reducing the pitch of the bond pads 106.

Bond pad pitch and associated packaging concerns are sometimes addressed by using special bonding techniques, such as "wedge-wedge" bonding (utilizing wedge shaped bonding pads) and "double-tier" bonding. These special bonding techniques are generally only available in expensive packages like pin grid arrays (PGAs) and are not suitable for use in mainstream plastic packages that are based on leadframes with a single tier of bonding fingers.

Also, a number of packaging technologies exist that permit reduced bond pad pitches, such as "flip-chip" (wherein connections are made to bump contacts covered with a conductive bonding agent on the face of a hybrid circuit) and tape automated bonding (TAB). Again, however, such techniques increase the cost and complexity of the packaging process.

In order to reduce bond pad pitch, semiconductor manufacturers have also created "staggered" bond pads 106, such as those illustrated in FIG. 1. In a staggered bonding approach, two staggered and substantially parallel rows of bond pads 106 are provided rather than a more conventional single row, in-line arrangement. The bond pads 106 of the outer row (closer to an edge 100a) are offset from the bond pads 106 of the inner row. As shown in FIG. 1, by similarly staggering the bonding areas of the bond fingers 102 effective bond pad pitch can be reduced while accounting for the aforementioned packaging and bonding limitations. Thus, a larger number of bond pads 106 may be accommodated in a given semiconductor die 100 area than could be accommodated by using single row, linear configuration of bond pads, and the occurrence of pad-limited designs is reduced.

Under certain circumstances, however, the staggered bonding areas of these leadframes or packaging substrates may actually necessitate an increase in the size of the semiconductor die 100. This is due in large part to the rigid nature of present staggered bonding approaches and associated manufacturing rules, in which the inner row (closer to core logic region 110) of bond pads 106 is required to be bonded to "outer" bonding areas 108 and bond pads 106 in the outer row are required to be bonded to inner bonding areas 108, as shown in FIG. 1. By allowing only a fixed number of bonding areas 108 in the inner and the outer rows of bonding areas of a leadframe L, it is often difficult to address variations in the configuration of bond pads 106 or pin ordering requirements without growing the size of the semiconductor die 100 to match the staggered pattern of the bonding areas 108.

SUMMARY OF THE INVENTION

Briefly, the present invention provides a leadframe design that allows wire bonding to alternate locations on a bond finger. The flexibility provided by this approach alleviates the necessity to enlarge a semiconductor die to accommodate the leadframe.

When implemented with a staggered bonding approach, individual bond fingers are provided with two or more bonding areas capable of receiving a bond wire. In one embodiment of the invention, conventional bond fingers having bonding areas in an outer row are augmented to include an additional trace (i.e., conductive) portion terminating in a bonding area that is in substantial axial alignment with an inner row of bonding areas that is closer to the semiconductor die. Likewise, the bond fingers having bonding areas in the inner row are enlarged to include an alternate bonding area that is in substantial axial alignment with the outer row of bonding areas. In another embodiment of the invention, bond fingers are arranged to provide multiple rows of closely staggered bonding areas to further reduce bond pad pitches.

By providing alternate bonding areas in individual bond fingers, the manufacturing rules addressing staggered bond wire placement can be followed more readily, while simultaneously allowing utilization of the most convenient bond fingers. The invention thereby adds significant flexibility to current staggered bonding approaches, and allows for a reduction in the size of many semiconductor dies.

BRIEF DESCRIPTION OF THE DRAWINGS

A better understanding of the present invention can be obtained when the following detailed description of the preferred embodiment is considered in conjunction with the following drawings, in which:

FIG. 1 is a plan view depicting various components of a typical semiconductor device package according to the prior art;

FIG. 2 is a plan view of a staggered bonding approach according to the prior art;

FIGS. 3 and 4 are plan views illustrating leadframe bond fingers incorporating alternate bonding areas in accordance with the present invention; and FIG. 5 is a plan view of an exemplary staggered bonding approach according to the present invention.

DETAILED DESCRIPTION OF THE PREFERRED EMBODIMENT

Referring now to the drawings, FIG. 2 shows a plan view of a staggered bonding approach according to the prior art. Throughout this specification, like numbers are used to refer to like elements in the various figures. In addition to the elements of FIG. 1, the package of FIG. 2 includes an optional power or $V_{dd}$ bus 116 and an optional ground or $V_{ss}$ bus 118. The semiconductor die 100 incorporates a first group of bond pads 106b forming an outer row disposed along the periphery of the semiconductor die 100. A second group of bond pads 106a forms an inner row. The bond pads 106a and 106b of the inner and outer rows are regularly-spaced and axially offset to form a staggered "zig-zag" pattern. Alternatively, the bond pads 106a or 106b may be irregularly spaced to better accommodate the approach angles of bond fingers 102 that converge on the semiconductor die 100 in a radial pattern. Various other bond pad 106 configurations are capable of being utilized with the present invention, such as those described in commonly-assigned U.S. Pat. No. 5,635,424, entitled "HIGH-DENSITY BOND PAD LAYOUT ARRANGEMENTS FOR SEMICONDUCTOR DIES, AND CONNECTING TO THE BOND PADS," which is hereby incorporated by reference for all purposes as if set forth in its entirety.

As shown in FIG. 2, connections to the $V_{ss}$ bus 118 and the $V_{dd}$ bus 116 are made to the outer row of bond pads 106b. This is frequently required by the manufacturing design rules associated with staggered bonding techniques, and functions to minimize the length of the bond wires 104 to the supply voltages, thereby reducing the parasitic inductances associated with such bond wires 104.

Turning to the leadframe L, a first group of bond fingers 102a provide an outer row of bonding areas 108a, while a second group of bond fingers 102b provides an inner row of bonding areas 108b. Manufacturing rules typically require that the outer bond pads 106b be bonded to inner bonding areas 108b and that inner bond pads 106a be bonded to outer bonding areas 108a.

In most staggered bonding arrangements, a dual-looping bond scheme is utilized to increase reliability by mitigating wire sweep problems created when liquid resin 101 is forced into the plastic mold cavity containing the bonded semiconductor die 100. Bond wires 104 are sometimes forced or swept closer together by the resin 101, resulting in the possibility of electrical shorts. With dual-looping, the trajectories of the bond wires 104a and 104b are placed in two planes rather than one, thereby creating a vertical spacing in addition to the horizontal separation between adjacent bond wires 104a or 104b. Since bond wire encroachment caused by sweeping generally occurs in the same plane, dual-looping considerably reduces the likelihood of electrical shorts between bond wires 104.

Most of today's wire bonders provide a programmable loop height control feature, as well as programmable bonding sequences. The loop height for the outer row of bond pads 106b is often chosen to be lower (closer to the leadframe L) than that of the inner row of bond pads 106a. Further, the outer row of bond pads 106b is preferably wire bonded first to minimize interference between the capillary (deposition portion) of the bonding machine and the bond wires 104b while the bond wires 104a are being formed.

As can be seen in FIG. 2, however, situations can arise wherein it may be necessary for the bond wires 104a and 104b to cross in order to comply with bonding rules. For example, in semiconductor die 100 designed to operate with high frequency inputs and outputs, it may be necessary to include a large number of bonding pads 106b for bonding to the $V_{dd}$ and the $V_{ss}$ busses 116 and 118 to provide electrical shielding between high frequency signal lines. This arrangement may conflict with a need to place certain signals provided by the bond pads 106 to adjacent ones of the bonding areas 108a and 108b. This situation may also necessitate the inclusion of dummy bond pads 106a (or 106b) that are not bonded out and are used to maintain proper spacing during the layout of the semiconductor die 100. The inclusion of dummy bond pads 106 is clearly undesirable in that extra silicon space may be sacrificed. Further, compliance with the manufacturing rules may result in many of the bond fingers remaining unused. Similar problems may arise when special buffering or analog circuitry is incorporated in enlarged custom pad cells.

Referring now to FIG. 3, bond fingers 102a and 102b incorporate a plurality of alternate bonding areas according to the present invention. Beginning with the bond fingers 102a, which typically include the outer bonding areas 108a, additional trace routing 200 is provided. The additional trace routing 200 electrically couples alternate bonding areas 202 to the individual bond fingers 102a. The intermediate portions of the bond fingers 102a between the bonding areas 108a and 202, in this case trace routing 200, are preferably of monolithic construction with the bond fingers 102a. The alternate bonding areas 202 are spaced apart from the outer bonding areas 108a, and are isolated from but in substantial axial alignment with the bonding areas 108b.

The bond fingers 102b, which normally provide the inner row of bonding areas 108b in a staggered bonding arrangement, are expanded in a similar manner to include alternate bonding areas 204 that are in substantially axial alignment with the inner bonding areas 108a. Preferably, the bonding area 204 of each of the bond fingers 102b is of uniform or monolithic construction with the other portions of the bond finger 102b, including the bonding area 108b. The intermediate portions of the bond fingers 102b between the bonding areas 204 and 108b correspond to the trace routing 200 of the bond fingers 102a.

Turning briefly to FIG. 5, an exemplary staggered bonding approach according to the present invention is shown. When viewed in conjunction with FIG. 2, certain benefits provided by this embodiment of the invention can be better understood. Specifically, the bonding areas 204 allow the bond wire 104a to be bonded to a more convenient bond finger 102b. Similarly, the bond wire 104b can now be bonded to a closer bonding area (202), reducing both the length of the bond wire 104b and the possibility of an electrical short with the bond wire 104a.

It is also contemplated that individual ones of the bond fingers 102 may incorporate either a single bonding area or more than two bonding areas. For example, additional bonding areas 208 may be provided on each of the bond fingers 102 to form an additional row. The bonding area 108 configurations shown in the FIGS. 3–5 are therefore exemplary, and are not intended to limit the scope of the invention to a particular number of bonding areas per bond finger 102. Further, the spacings between the bonding areas 108a and 204, as well as the spacings between bonding areas 108b and 202, need not be equal and typically relate to the bond pad pitch of the bond pads 106a and 106b as best shown in FIG. 5.

The alternate bonding areas 202, 204 and 208 thereby function to provide greater flexibility in the wire bonding process, often allowing utilization of a greater number of bond fingers 102. The alternate bonding areas 202, 204 and 208 also permit easier compliance with the aforementioned manufacturing rules. In certain situations, a leadframe L manufactured in accordance with the present invention also reduces the possibility that semiconductor dies 100 will need to be enlarged due to the arrangement of bonding areas 108.

Referring now to FIG. 4, an alternate embodiment of a leadframe L manufactured according to the present invention is shown. In this embodiment of the invention, the bond fingers 102a and 102b are more closely spaced. Further, the bonding areas 108a and 204 are slightly staggered to accommodate the reduced spacing. Likewise, the bonding areas 108b and 202 are also slightly staggered to maintain sufficient area to receive a bond wire 104. In this embodiment of the invention, the distance D1 between the bonding areas 204 or 108b is less than the width D2 of the individual bonding areas 108a or 108b.

It is also contemplated that the traditional bond fingers 102 may be further modified to accommodate more than two bonding areas apiece, with necessary variations to the staggered arrangement. The leadframe of FIG. 4 is particularly useful for bonding to comparatively small semiconductor dies 100.

Most leadframes are designed using standard computer-assisted design (CAD) tools having algorithms for bond finger layout. The invention can be implemented by modifying these CAD tools to generate bond finger designs having the dual bonding area structures. The production method utilized to manufacture leadframes L in accordance with the invention is not considered critical to the invention. Traditional stamping techniques may be employed. Alternatively, laser cutting of the bond fingers 102 may be utilized, such as the technique disclosed in commonly-assigned U.S. Pat. No. 5,656,854, entitled "LEAD FRAME FOR A MULTIPLICITY OF TERMINALS," and hereby incorporated by reference for all purposes as if set forth in its entirety.

While the disclosed embodiment of the invention utilizes a leadframe L, it is also applicable to the design of other types of package substrates, such as those used in ball-grid arrays (BGAs). A BGA is an integrated circuit surface mount package with an array of solder balls that are attached to the bottom side of a thin, patterned substrate with conductive routing layers that include areas similar to the disclosed bond fingers 102. The solder balls are typically formed via a reflow process, while the semiconductor die 100 may be attached to the substrate using wire bonding or flip-chip interconnection. An exemplary BGA package capable of utilizing the present invention is disclosed in commonly-assigned U.S. patent application Ser. No. 08/932,711, filed Sep. 17, 1997, entitled "Interposer For Ball Grid Array (BGA) Package," and hereby incorporated by reference for all purposes.

Thus, a leadframe having individual bond fingers incorporating two or more bonding areas capable of receiving a bond wire has been described. By providing alternate bonding areas in individual bond fingers, manufacturing rules addressing staggered bond wire placement can be followed more readily, while simultaneously permitting the most convenient bond fingers to be utilized. The invention thereby adds significant flexibility to present staggered bonding processes and reduces the number of instances in which a semiconductor die must be enlarged to accommodate a leadframe with staggered bonding areas.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A semiconductor device assembly, comprising:

an integrated circuit die having a plurality of bond pads;

a leadframe having a plurality of electrically conductive bond fingers, the bond fingers having a plurality of alternate bonding areas for receiving a bond wire;

a plurality of bond wires electrically coupling predetermined ones of the bond pads to predetermined ones of the bonding areas; wherein the plurality of alternate bonding areas comprise first and second bonding areas, each of the first bonding areas being closer to the integrated circuit than a corresponding one of the corresponding second bonding areas, the at least one bond finger further comprising an intermediate portion separating the first and second bonding areas, the first and second bonding areas having a width greater than the width of the intermediate portion of the bond finger;

a first one of the plurality of bond wires is coupled to one of the first bonding areas; and a second one of the plurality of bond wires is coupled to one of the second bonding areas.

2. The semiconductor device assembly of claim 1, wherein the first bonding areas of adjacent bond fingers form a first row having a substantially axial alignment and wherein the second bonding areas of adjacent bond fingers form a second row having a substantially axial alignment.

3. The semiconductor device assembly of claim 1, wherein the first bonding areas of adjacent bond fingers form a first row having a staggered alignment and wherein the second bonding areas of adjacent bond fingers form a second row having a staggered alignment.

4. The semiconductor device assembly of claim 3, wherein the distance between adjacent ones of the bonding areas of adjacent bond fingers is less than the width of an individual bonding area.

5. The semiconductor device assembly of claim 1, wherein the plurality of alternate bonding areas of each of the plurality of electrically conductive bond fingers comprise at least three bonding areas.

6. The semiconductor device assembly of claim 5, wherein the bonding areas of adjacent bond fingers form at least three rows, each of the rows having a substantially axial alignment.

7. The semiconductor device assembly of claim 1, wherein the integrated circuit die, the bond wire, and a substantial portion of the leadframe are encapsulated in resin or other suitable packaging material.

8. The semiconductor device assembly of claim 1 wherein at least one of the bonding areas is substantially square shaped.

* * * * *